US006248621B1

(12) United States Patent
Wilk et al.

(10) Patent No.: US 6,248,621 B1
(45) Date of Patent: Jun. 19, 2001

(54) METHOD OF GROWING HIGH-QUALITY CRYSTALLINE SILICON QUANTUM WELLS FOR RTD STRUCTURES

(75) Inventors: Glen D. Wilk, Dallas; John M. Anthony, McKinney, both of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/421,011

(22) Filed: Oct. 20, 1999

Related U.S. Application Data

(62) Division of application No. 09/211,948, filed on Dec. 15, 1998, now Pat. No. 6,069,368.
(60) Provisional application No. 60/069,442, filed on Dec. 15, 1997.

(51) Int. Cl.[7] .................................................. H01L 21/8234
(52) U.S. Cl. ........................................... 438/237; 438/979
(58) Field of Search ................................. 438/237, 979; 257/9, 15, 25, 35; 47/947

(56) References Cited

U.S. PATENT DOCUMENTS

| 5,478,653 | * | 12/1995 | Guenzer | 428/446 |
| 5,723,872 | * | 3/1998 | Seabaugh et al. | 257/25 |
| 5,830,270 | * | 11/1998 | McKee et al. | 117/106 |

FOREIGN PATENT DOCUMENTS

| 402137379 | * | 5/1990 | (JP) | 257/31 |

OTHER PUBLICATIONS

Moon et al, Journal of Crystal Growth 162 (1996) 154–160.*

* cited by examiner

Primary Examiner—Matthew Smith
Assistant Examiner—Craig P. Lytle
(74) Attorney, Agent, or Firm—Wade James Brady, III; Frederick J. Telecky, Jr.

(57) ABSTRACT

A method of forming a crystalline silicon well over a perovskite barrier layer, preferably for use in formation of a resonant tunneling diode. A silicon substrate (1) is provided of predetermined crystallographic orientation. A layer of crystallographic perovskite material (5) is formed over the silicon substrate and substantially matched to the lattice constant of the silicon substrate. A layer of crystallographic silicon (7) is formed over the perovskite layer substantially matched to the lattice constant of the perovskite layer. The perovskite layer is formed by the steps of placing the silicon substrate in a chamber and then evaporating a layer of barium strontium oxide (3) thereon with a thickness of from about three to about six Angstroms and then evaporating a layer of calcium strontium titanate (5) thereon having a thickness of from about six to about 25 Angstroms thereon in the case of a tunneling diode. A second layer of silicon oxide (9) is provided on the layer of silicon remote from the perovskite layer.

12 Claims, 1 Drawing Sheet

METHOD OF GROWING HIGH-QUALITY CRYSTALLINE SILICON QUANTUM WELLS FOR RTD STRUCTURES

CROSS REFERENCE TO PRIOR APPLICATIONS

This application is a division of Serial No. 09/211,948, filed Dec. 15, 1998, now U.S. Pat. No. 6,069,368, which claims the benefit of Provisional Application 60/069,442, filed Dec. 15, 1997.

BACKGROUND OF THE INVENTION

1. Field of the Invention

This invention relates to the formation of perovskite crystalline oxide barriers for use in semiconductor devices with particular but not sole use in connection with resonant tunneling diodes having silicon wells.

2. Brief Description of the Prior Art

Resonant tunneling diodes are typically devices which are built on a semiconductor substrate, generally having (100) crystallographic orientation. The silicon-based diode structure generally includes a thin barrier layer of silicon oxide over the substrate onto which is deposited a layer of silicon. A further barrier layer of silicon oxide is deposited over the silicon layer with a gate electrode, generally aluminum, formed thereover to complete the diode structure. According to the I–V (current vs. voltage) curve of such diodes, at a low voltage (below about 1 volt) across the diode as shown in FIG. 1 at voltage $V_1$ in the current flow observed at voltages closely below and closely above voltage $V_1$, this voltage rapidly tapering off at voltage $V_2$ and then rising exponentially starting at voltage $V_3$. This phenomenon occurs because current flow generally does not occur until the current is able to go over the energy barrier of the barrier layer of the tunneling diode. However, if the barrier layer is sufficiently thin, such as from about 2 to about 8 monolayers or from about 6 to about 25 Angstroms (this distance depending upon the barrier layer molecules involved), then electrons can tunnel through the barrier. Furthermore, if the silicon well is sufficiently thin and crystalline, i.e. from about 2 to about 8 monolayers and preferably about 5 monolayers or about 15 Angstroms, quantum levels are set up within the quantum well. Accordingly, if the voltage is tuned properly, the electron energy will align with one of the quantum states and travel through the quantum well as well as the barriers. However, if the voltage is such that the electron energy is not aligned with a quantum state (e.g. $<V_1$ volts) and has no quantum state in which to tunnel, the current flow drops until the energy level is sufficient to go over the barrier or until a higher quantum state, if present, has been reached. This explains the sudden peak in current flow at about $V_1$ volts as discussed above and shown in FIG. 1. It follows that with sufficiently thin crystalline layers, tunneling is obtained to provide high current flow with low voltage levels. This is an important attribute in view of the present direction of the art toward the use of lower voltage components.

A key to the operation described above is that the well must by crystalline. This has not presented a problem in the prior art devices which are based upon gallium arsenide because an epitaxially deposited aluminum gallium arsenide insulator layer can be formed over crystalline gallium arsenide. Crystalline gallium arsenide is a semiconductor with sufficiently close crystallographic lattice structure match to the aluminum gallium arsenide insulator such that the deposited insulator is also crystalline and this therefore supports formation of a crystalline gallium arsenide structure thereover. This situation is not available using a silicon semiconductor well and using prior art techniques. The reason is that, in the fabrication of a silicon-based tunneling device, though starting with a crystalline (100) silicon substrate, the first barrier layer of silicon dioxide formed thereon by standard processing techniques cannot sustain a crystalline silicon layer thereover. The silicon dioxide layer over the crystalline substrate is amorphous, resulting in a silicon well which is also amorphous. The fabrication of silicon-based resonant tunneling diodes (RTDs) requires a high quality, crystalline quantum well surrounded by ultrathin barriers, which provide a suitable offset in the conduction band from the substrate and insulating barriers. Many materials can provide a large conduction band offset, however most of these materials yield a poor quality silicon quantum well. The ability to grow epitaxial, silicon lattice-matched insulators directly on silicon would allow fabrication of high quality silicon quantum wells for RTD and other applications.

SUMMARY OF THE INVENTION

In accordance with the present invention, there is provided a method whereby high quality silicon quantum wells can be fabricated for RTDs and other applications. The method involves growth of lattice-matched electrically insulating films directly on Si (100) which do not react with the silicon substrate or the silicon quantum well. This allows growth of a single crystal silicon quantum well and extremely sharp interfaces between the electrically insulating layers and the quantum well. This is essential for high performance RTDs. Other prior art methods involve insulating materials which react with the surrounding silicon and which yield defective polycrystalline silicon quantum wells.

The method in accordance with the present invention uses crystalline silicon for the quantum well and a perovskite material having a crystal lattice constant which matches that of silicon (100) sufficiently closely to be able to be formed over a silicon (100) substrate in crystallographic form to about one percent difference in lattice constant. In particular, barium titanate, calcium strontium titanate and barium strontium titanate have this property and are preferred barrier layer materials, preferably in combination, in accordance with the present invention. These materials can be grown directly on silicon (100) with the initial deposition of a transition layer on the silicon (100) surface. By first depositing a barium strontium oxide layer which is several unit cells thick ranging from one to about five unit cells, preferably one or two unit cells, followed by deposition of a calcium strontium titanate ($Ca(Sr)TiO_3$) layer, also several units thick ranging from one to about five unit cells and preferably one or two unit cells, crystalline silicon can be overgrown on this layer with very high quality. The particular composition or ratio of calcium to strontium in the formulation of $Ca_x(Sr_{1-x})TiO_3$ forming the films determines the lattice constant, and this can be matched to that of silicon with only about 0.3 percent mismatch. For the very thin films required for silicon quantum wells (from about 1 to about 5 nanometers), this mismatch is sufficiently small to easily allow overgrowth of high quality silicon. This approach therefore avoids the problems with most other methods because there is no concern for interface reaction and film uniformity of the electrically insulating barrier on the substrate.

The ability to deposit an electrically insulating, lattice-matched material directly on Si (100) allows for high quality overgrowth of a silicon quantum well. Most prior art attempts at solutions to the above-described problem involve either amorphous insulating films (which result in amorphous or highly defective silicon quantum wells) or crystalline insulators such as $CaF_2$ which result in a significant reaction between the $CaF_2$ and silicon, again resulting in a defective silicon quantum well. Since a well ordered, highly uniform and sharp interface is required for electron coherence in an RTD, these diffuse reaction layers may be unacceptable for use in RTDs. The BaSrO and $Ca(Sr)TiO_3$ layers are largely unreactive and do not form a reaction layer at the silicon interface. These layers are also more stable at higher temperatures than the other materials that can be used, such as, for example, zinc sulfide.

In the above described manner, the perovskite film is a barrier with a conduction band offset and a crystalline silicon quantum well can be deposited over this perovskite layer to form a high quality crystalline silicon quantum well with sharp, well defined interfaces which are necessary for electron coherence in transport for the RTD operation. Once the silicon quantum well has been deposited on the crystalline perovskite film, the process can be repeated so that a second film of perovskite material or crystalline silicon oxide can be grown over the silicon well. Alternatively, since the crystalline quality of the second barrier is not critical, an amorphous silicon oxide layer can also be grown as the second barrier over the silicon well by standard thermal or ultraviolet ozone techniques. This approach avoids the need for introduction of other lattice-matched materials (such as $CaF_2$) which create additional problems as noted above.

DESCRIPTION OF THE PREFERRED EMBODIMENT

Figure 1:
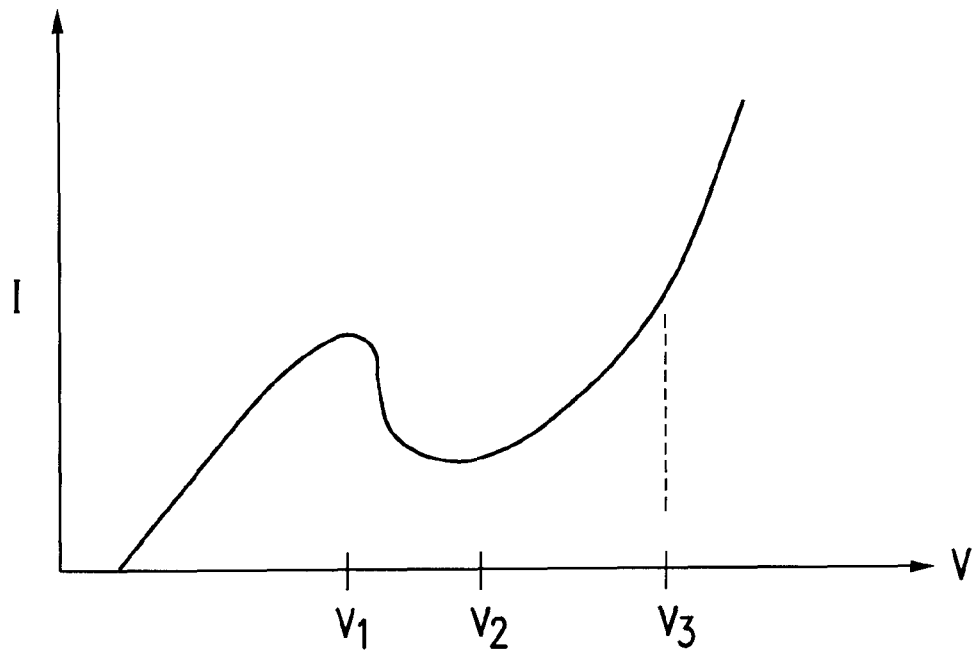
FIG. 1 is a characteristic I–V curve of an RTD in accordance with the present invention.
Figure 2:
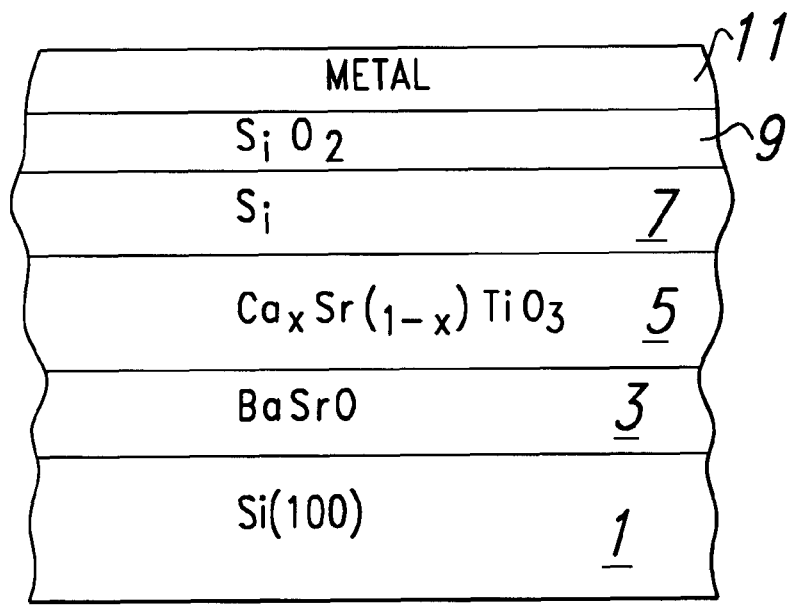
FIG. 2 is a schematic diagram of a silicon-based resonant tunneling diode in accordance with the present invention.

To provide a resonant silicon-based tunneling diode in accordance with the present invention and with reference to FIG. 2, there is initially provided a substrate of silicon 1 having (100) crystallographic orientation. The substrate 1 is placed in a chamber and an optional six Angstrom crystalline layer of barium strontium oxide 3 is evaporated thereon followed by a 15 Angstrom crystalline layer of calcium strontium titanate 5 with the ratio of calcium to strontium being 70:30. A 20 Angstrom layer of silicon 7 is then epitaxially deposited over the crystalline perovskite layer 5, this layer being crystalline in form since the layer 5 thereunder is crystalline and lattice-matched to silicon. A further layer of silicon oxide 9 is formed over the silicon layer 7 either by standard silicon dioxide formation techniques, preferably chemical vapor deposition (CVD) or by a repeat of the procedure used to form the perovskite layer 5 since this layer can be amorphous. A metal gate 11, preferably of doped polysilicon, is then deposited over the silicon oxide layer 7 to complete formation of the diode.

Though the invention has been described with reference to specific preferred embodiments thereof, many variations and modification will immediately become apparent to those skilled in the art. It is therefore the intention that the appended claims be interpreted as broadly as possible in view of the prior art to include all such variations and modifications.

What is claimed is:

1. A method of forming a silicon well over a perovskite barrier layer which comprises the steps of:

(a) providing a silicon substrate of predetermined crystallographic orientation;

(b) forming a perovskite layer over said silicon substrate substantially matched to the crystallographic orientation of said silicon substrate; and (c) forming a layer of crystallographic silicon over said perovskite layer substantially matched to the crystallographic orientation of said perovskite layer.

2. The method of claim 1 wherein said perovskite layer is formed by the steps of placing said silicon substrate in a chamber, providing within said chamber a layer of barium strontium oxide on said silicon substrate and then providing a layer of calcium strontium titanate over said barium strontium oxide.

3. The method of claim 2 wherein said layer of barium strontium oxide has a thickness of from about three to about six Angstroms.

4. The method of claim 3 wherein said layer of calcium strontium titanate has a thickness of from about six to about 25 Angstroms.

5. The method of claim 4 wherein said layer of crystallographic silicon has a thickness of from about 2 to about 8 monolayers.

6. The method of claim 4 further including a layer of silicon oxide on said layer of silicon remote from said perovskite layer.

7. The method of claim 3 wherein said layer of crystallographic silicon has a thickness of from about 2 to about 8 monolayers.

8. The method of claim 2 wherein said layer of calcium strontium titanate has a thickness of from about six to about 25 Angstroms.

9. The method of claim 8 wherein said layer of crystallographic silicon has a thickness of from about 2 to about 8 monolayers.

10. The method of claim 2 wherein said layer of crystallographic silicon has a thickness of from about 2 to about 8 monolayers.

11. The method of claim 2 further including a layer of silicon oxide on said layer of silicon remote from said perovskite layer.

12. The method of claim 1 wherein said layer of crystallographic silicon has a thickness of from about 2 to about 8 monolayers.

* * * * *